United States Patent [19]

Winslow

[11] 4,359,682
[45] Nov. 16, 1982

[54] METHOD AND APPARATUS FOR TESTING THE OUTPUT REFLECTION COEFFICIENT OF AN AUTOMATIC LEVEL CONTROLLED SOURCE

[75] Inventor: Phillip D. Winslow, Loveland, Colo.

[73] Assignee: Hewlett-Packard Company, Palo Alto, Calif.

[21] Appl. No.: 168,973

[22] Filed: Jul. 14, 1980

[51] Int. Cl.³ ............................................. G01R 27/04
[52] U.S. Cl. ................................... 324/58 B; 364/481
[58] Field of Search ............... 324/58 B; 323/234, 235, 323/266, 293; 364/481

[56] References Cited

U.S. PATENT DOCUMENTS 2,876,416  3/1959  Vinding ............................. 324/58 B
3,355,663  11/1967  Aronoff ............................ 324/58 B

FOREIGN PATENT DOCUMENTS

970830  7/1975  Canada ............................. 324/58 B
283331  11/1971  U.S.S.R. ........................... 324/58 B Primary Examiner—Stanley T. Krawczewicz
Attorney, Agent, or Firm—John A. Frazzini

[57] ABSTRACT

A method is disclosed for measuring the absolute value of the reflection coefficient between a transmission line of known characteristic impedance and the output port of an automatic level controlled source (i.e., ALC source). The ALC source is activated and a signal source is coupled to the output port of the ALC source via the transmission line to apply a test signal of amplitude $V_t$ to perturb the output signal of the ALC source. The magnitude of the amplitude modulation component of the resulting perturbed output signal is detected for use in combination with the value of $V_t$ in calculating the absolute value of the reflection coefficient. An apparatus is also disclosed for applying measuring the absolute value of the reflection coefficient. Alternatively, an on-carrier test signal is employed to perturb the output signal. The magnitude of variation of the amplitude of the output signal, as the phase of the test signal is varied, is determined for use in calculating the absolute value of the reflection coefficient.

10 Claims, 9 Drawing Figures

METHOD AND APPARATUS FOR TESTING THE OUTPUT REFLECTION COEFFICIENT OF AN AUTOMATIC LEVEL CONTROLLED SOURCE

BACKGROUND OF THE INVENTION

The disclosed invention is concerned generally with methods for measuring the output reflection coefficient or return loss of circuits and more particularly with measuring the output reflection coefficient of an automatic level controlled source (i.e., an ALC source). An ALC source (also known as a level compensator) is a circuit which produces an output signal having a precisely regulated amplitude.

Figure 1:
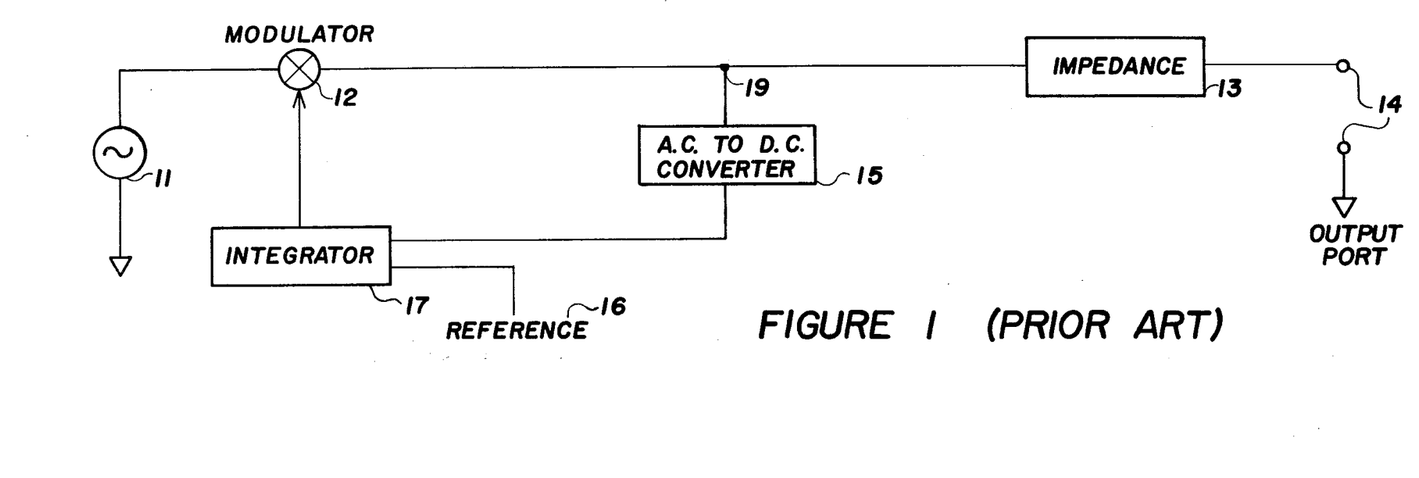
FIG. 1 shows a block diagram of a typical prior art ALC source.

In a typical ALC source shown in FIG. 1, a source signal is applied to the input of a modulator to produce an output signal. An amplitude detector is employed to produce a d.c. signal proportional to the amplitude of the amplifier output signal. The difference between the d.c. signal from the amplitude detector and a reference signal $V_{ref}$ is produced and is used to regulate the gain of the modulator in order to hold constant the amplitude of the output signal. The value of the amplitude is determined by the value of $V_{ref}$.

After the leveling loop has settled to its steady state condition, the modulator holds the amplitude of the output signal nearly constant, so that the output of the modulator is electrically equivalent to an ideal voltage generator. The output impedance of the ALC source is selected by attaching an impedance element of selected impedance in series with the output of the modulator. The value of output impedance is typically selected as a standardized value of 50 ohms or 75 ohms.

ALC sources are often employed at the output port of signal generators to precisely define the amplitude of generated signals. The output reflection coefficient of the signal generator affects the responses of test circuits to signals from the signal generator so that it is important to precisely determine the output reflection coefficient of the signal generator. This determination in turn requires the ability to measure the output reflection coefficient of an ALC source. Although the output impedance is typically selected to be 50 ohms or 75 ohms, stray capacitance and inductance can produce parasitic impedances which contribute to the output impedance. In addition, errors can be made in the selection of the impedance element which defines the output impedance of the ALC source so that it is important to be able to test the actual output impedance of an ALC source and not just calculate it from the impedances of its component elements. The parasitic impedances are typically voltage dependent and thus must be measured under standard operating conditions. Also, the output of the amplifier will only approximate an ideal voltage source when the ALC source is active so that a method must be devised for measuring the output reflection coefficient of an ALC source under operating conditions.

It is well known that the output reflection coefficient of a circuit can be measured by attaching a directional bridge to the output port of the circuit and launching a test signal through the bridge towards the ALC source. Part of the test signal reflects at the output port of the ALC source due to the inequality between the circuit output impedance $Z_{out}$ and the characteristic impedance $Z_o$ of the transmission line. The ratio between the reflected signal and the test signal equals the reflection coefficient p which is related to output impedance and the characteristic impedance by the relation p equals $(Z_{out}-Z_o)/(Z_{out}+Z_o)$ (see Millman and Taub, *Pulse, Digital, and Switching Waveforms*, McGraw Hill Book Co., 1965, pages 90-93). The output impedance can thus be determined from $Z_o$ and from the relative amplitude and phase between the test signal and the reflected signal.

Surprisingly, this method for measuring output impedance fails when applied to an ALC source. It was expected that the test signal would produce a simple reflected signal to add to the generated signal of the ALC source. However, when the frequency of the test signal is within the bandwidth of the leveling loop, a pair of additional signals are produced which are proportional to the amplitude of the test signal but are not proportional to the reflection coefficient. The prior art methods for determining output impedance are thus inapplicable to ALC sources.

SUMMARY OF THE INVENTION

The disclosed invention provides a method for measuring the output reflection coefficient of any signal source including an automatic level controlled source (i.e., an ALC source). In an ALC source, a source sine wave of frequency $f_s$ is applied to the input port of a modulator to produce a sine wave output signal of precise constant amplitude and of carrier frequency $f_s$ at the output port of the modulator.

A sine wave test signal of frequency $f_t$ and of much smaller amplitude than the amplitude of the output signal is applied through a transmission line of known impedance to the output port and the resulting perturbed output signal is detected. The perturbed output signal is an amplitude and phase modulated sine wave of carrier frequency $f_s$. The component of amplitude modulation is detected to produce a modulation signal. The relative amplitude of the modulation signal to the test signal is used to determine the absolute value of the output reflection coefficient of the ALC source. Alternatively, the test signal is selected to have a frequency $f_t$ equal to the carrier frequency $f_s$. The phase of the test signal is stepped or swept through a range of values which include at least one maximum and one minimum of the amplitude of the output signal. The difference between the maximum and minimum values of the amplitude of the output signal is determined and the difference is divided by twice the peak amplitude of the test signal to produce the absolute value of the output reflection coefficient of the ALC source. In the method in which the phase is stepped through a range of values an amplitude detector is employed to determine the maximum and minimum values of the output signal. In the method in which the phase is swept through a range of values, the difference between the maximum and minimum values of the output signal is measured with an amplitude modulation detector.

DESCRIPTION OF THE PREFERRED EMBODIMENT

Automatic level controlled sources (hereinafter referred to as ALC sources) are typically designed to have a standardized value of output impedance, but the actual value can vary because of errors in the selection of circuit elements and because of non-ideal behavior of circuit elements. In particular stray capacitances and inductances of circuit elements under operating conditions contribute to the total output impedance. Accurate knowledge of the output impedance under operating conditions is needed to evaluate the output signal supplied by the ALC source because deviations from the designed output impedance will produce reflected signals at the output port which perturb the output signal.

A typical ALC source is illustrated schematically in FIG. 1. A source 11 supplies a source signal to a first input of a modulator 12 to produce an output signal of carrier frequency $f_s$ at a node 19. An a.c. to d.c. converter produces a d.c. signal proportional to the amplitude of the carrier signal for use in modulating the output signal. An integrator 17 produces a difference signal proportional to the integral of the difference between the d.c. signal and a voltage $V_{ref}$ of a reference voltage source 16. The difference signal is applied to a second input of modulator 12 to modulate the source signal applied at the first input of modulator 12 in order to hold constant the amplitude of the output signal. In an ideal ALC source having no parasitic impedance and having perfect regulation to hold constant the amplitude of the voltage on node 19, the output impedance at an output port 14 is equal to the impedance of an element 13 connected between node 19 and port 14.

Figure 2:
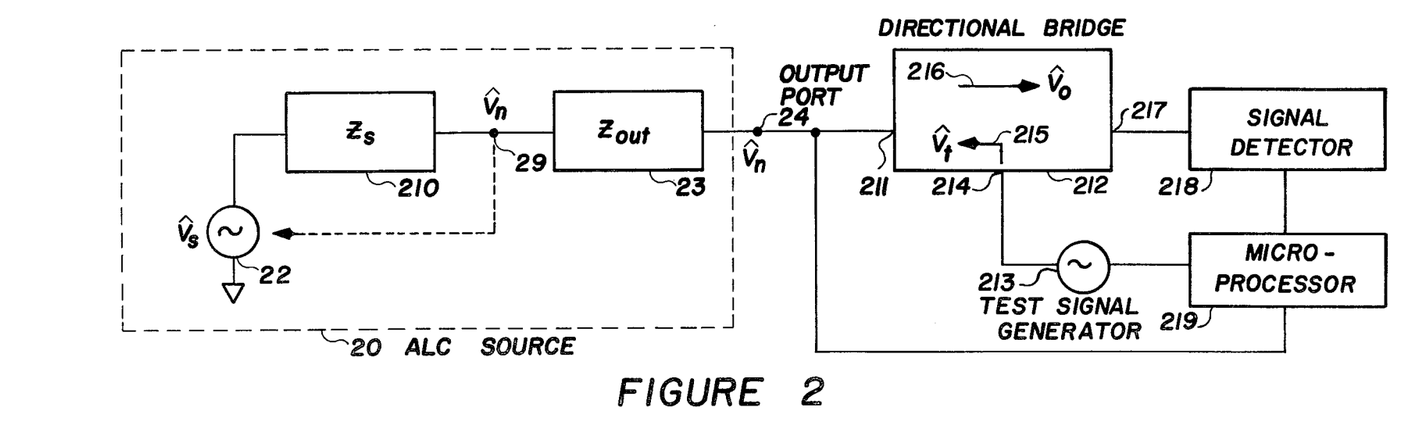
FIG. 2 shows a block diagram of a preferred embodiment of the disclosed apparatus coupled to a Thevinized equivalent of an ALC source.
Figure 3A:
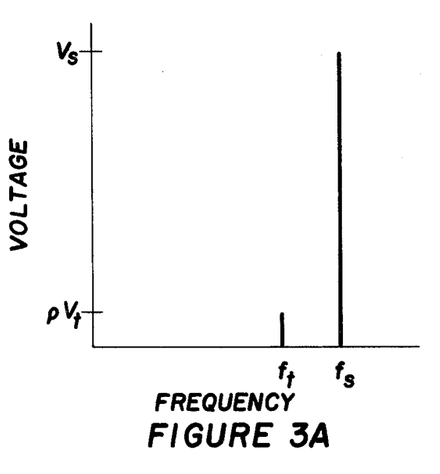
FIG. 3A shows the expected spectral distribution of the output travelling wave from an ALC source under test.
Figure 3B:
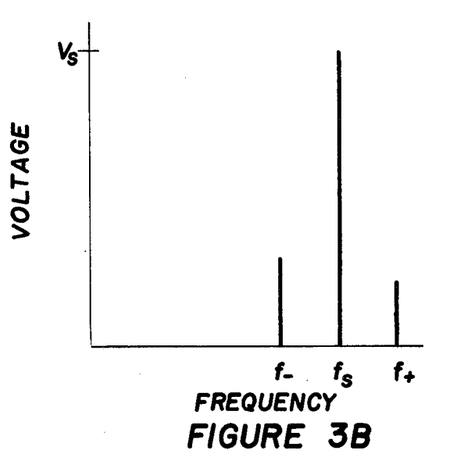
FIG. 3B shows the actual spectral distribution of the output travelling wave from an ALC source under test.

A Thevenin equivalent of a non-ideal ALC source is shown as block 20 in FIG. 2. The impedance due to the combination of source 11, modulator 12 and a.c. to d.c. converter 15 of FIG. 1 is represented in FIG. 2 by element 210 of impedance $Z_s$. Element 210 is in series with an ideal sine wave generator 22 which produces a signal of amplitude $V_s$ and frequency $f_s$ and is also in series with an element 23 of impedance $Z_{out}$ equal to the impedance of element 13 plus the parasitic impedance. Output port 24 and node 29 correspond respectively to port 14 and node 19 of FIG. 1. The net signal $\hat{V}_o$ propagating out of the ALC source is shown as signal 216. (In general, a voltage or current written with a hat over the corresponding variable indicates the corresponding complex variables written in phasor notation. An unhatted voltage or current represents the constant amplitude of the corresponding voltage or current.) The dotted line from node 29 to generator 22 indicates that the amplitude $V_s$ of the source signal produced by generator 22 is regulated to maintain a constant amplitude $V_{nom}$ for the signal on node 29.

To test the value of $Z_{out}$ a signal source 213 (such as the Hewlett-Packard HF signal generator model 3335A) is coupled to output port 24 to apply a small sine wave test signal 215 of amplitude $V_t$ and frequency $f_t$ to output port 24. $V_t$ is chosen much smaller than $V_{nom}$ so that the test signal will not disrupt operation of the ALC source. A directional bridge 212 of characteristic impedance $Z_o$ (such as the HP 8721 by the Hewlett-Packard Company) is employed to couple source 213 to port 24 in order to separate output signal 216 from test signal 215 to facilitate analysis of the output signal. Thus, source 213 is coupled to the directional bridge input port 214, a signal detector 218 is coupled to the directional bridge output port 217 and port 24 is coupled to the directional bridge transmission port 211.

If $Z_s$ were zero the current at node 29 due to test signal 215 would not produce any voltage drop at node 29 and therefore would not interact with modulator 12 via perturbation of the difference signal. In such a case output signal 216 would be the sum of the ALC source signal of amplitude $V_{nom}$ and frequency $f_s$ plus the reflected signal of amplitude $rV_t$ where r is the absolute value of the reflection coefficient (i.e., $r=|\rho|=|(Z_{out}-Z_o)/(Z_{out}+Z_o)|$).

When $Z_s$ is nonzero test signal 215 produces a voltage drop at node 29 which adds to the signal from generator 22 to produce a net voltage $\hat{V}_n$. As shown in the appendix, a signal which is the sum of two signals of unequal frequencies is equivalent to a sine wave signal which is both amplitude and phase modulated. The ALC source is designed to eliminate variation in the amplitude of the signal on node 29 by suitably modulating the signal $\hat{V}_s$ produced by generator 22. Therefore, the signal $\hat{V}_n$ on node 29 has constant amplitude and thus is a phase modulated signal. This phase modulation of $\hat{V}_n$ will affect the phase modulation component of output signal 216 but will not affect the amplitude modulation component which continues to be proportional to $\rho$. Thus, detector 218 is selected to be an amplitude modulation detector such as the HP 1096A by the Hewlett-Packard Company.

That the amplitude modulation component of output signal 216 will continue to be proportional to $\rho$ can be seen as follows. Test signal 215 corresponds to a travelling wave current $\hat{I}_t$ flowing from generator 213 toward node 24. This current produces a voltage $\hat{V}_t=\hat{I}_t Z_o$ in the directional bridge and produces voltage drops across $Z_{out}$ and $Z_s$. Likewise output signal 216 corresponds to a travelling wave current $\hat{I}_o=\hat{V}_o/Z_o$ flowing from node 29 toward detector 218. These currents produce a voltage at port 24 equal to $\hat{V}_n+(\hat{I}_t-\hat{I}_o)Z_{out}=\hat{V}_n+(\hat{V}_t-\hat{V}_o)Z_{out}/Z_o$ which also equals the waveguide voltage at output boundary 211: $\hat{V}_t+\hat{V}_o$. Thus, $\hat{V}_o=\rho\hat{V}_t+Z_o \hat{V}_n/(Z_{out}+Z_o)$.

As shown in the appendix an amplitude modulated signal V of frequency f can be written as $\hat{V}_c+\hat{V}_a$ where $\hat{V}_c$ is a pure sine wave of carrier frequency f and $\hat{V}_a$ is the amplitude modulation component. Similarly a phase modulated signal $\hat{V}'$ of frequency f and a signal $\hat{V}''$ of frequency f which is both phase and amplitude modulated can be written respectively as $\hat{V}_c'+\hat{V}_p'$ and $\hat{V}_c''+\hat{V}_p''$ where $\hat{V}_c'$ and $\hat{V}_c''$ are sine waves of frequency f, where $\hat{V}_a''$ is an amplitude modulation component, and where $\hat{V}_p'$ and $\hat{V}_p''$ are phase modulation components. Thus, $\hat{V}_n$ can be written as $\hat{V}_{nc}+\hat{V}_{np}$ and $\hat{V}_t$ can be written as $\hat{V}_{ta}+\hat{V}_{tp}$. The equation for $\hat{V}_o$ can be rewritten as $\hat{V}_o=\rho(\hat{V}_{ta}+\hat{V}_{tp})+Z_o(\hat{V}_{nc}+\hat{V}_{np})/(Z_{out}+Z_o)$. This shows that the amplitude modulation component of $\hat{V}_o$ (i.e. $\rho\hat{V}_{ta}$) continues to be proportional to $\rho$. However, the phase modulation component (i.e., $\rho\hat{V}_{tp}+Z_o\hat{V}_{np}/(Z_{out}+Z_o)$) and the carrier frequency component (i.e., $Z_oV_{nc}/(Z_{out}+Z_o)$) are not proportional to $\rho$.

The above derivation assumed that the voltage $V_n$ on node 29 had constant amplitude. This assumption requires that the feedback loop have a response time T which is much shorter than the characteristic time of variation of the amplitude of the signal on node 29. Because the sum of waves at frequencies $f_s$ and $f_t$ produce an amplitude modulation at the beat frequency $|f_t-f_s|$, in order for the ALC source to eliminate this modulation, T must be much smaller than $|f_s-f_t|^{-1}$. Conversely, distortion of the primary signal of frequency $f_s$ will only be avoided if T is much larger than the period $f_s^{-1}$ of the primary signal. Since $f_s$ and T are determined by the ALC source under test, the frequency $f_t$ of the test signal will be selected to satisfy the above constraints. For example, for a 1 MHz carrier frequency $f_s$ the test signal will typically have a frequency differing from $f_s$ by 0.1–10 Hz.

Because an amplitude modulation detector only measures the magnitude of amplitude modulation, only the absolute value of $\rho$ (i.e., r) is determined by this method. Typically only r is of interest anyway because generally only the amplitudes of the reflected signals from the ALC source are used in calculating load power error due to the deviation of the ALC source output impedance from $Z_{out}$.

The value of r is equal to two times the ratio of the component of amplitude modulation to the amplitude $V_t$ of the test signal. The calculation of r can be performed in a microprocessor 219 (such as the MC6800A by Motorolla) which is coupled to source 213 to read the value of $V_t$ and which is coupled to detector 218 to read the magnitude of the amplitude modulation component.

The magnitude r of the reflection coefficient $\rho$ can also be tested using an on-carrier test signal $\hat{V}_t$ having the same frequency as the ALC source (i.e., $f_t=f_s$). The effect of the small test signal can be seen by solving for $\hat{V}_n$ in terms of the test signal $\hat{V}_t$ and the source signal $\hat{V}_s$ of generator 22. From Ohm's Law, $\hat{V}_n$ is equal to $\hat{V}_s+(I_t-I_o)Z_s$ which can be rewritten as $\hat{V}_s+(\hat{V}_t-\hat{V}_o)Z_s/Z_o$. The previously derived equation for $\hat{V}_o$ (i.e., $\hat{V}_o=\rho\hat{V}_t+Z_o\hat{V}_n/(Z_{out}+Z_o)$) can be used to eliminate $\hat{V}_o$ from this equation to show that $\hat{V}_n=[(Z_{out}+Z_o)\hat{V}_s+2Z_s\hat{V}_t]/(Z_{out}+Z_o-Z_s)$. Since $\hat{V}_n$ is a phase modulated signal on carrier frequency $f_s$, $\hat{V}_s$ is an amplitude modulated signal of carrier frequency $f_s$ and $\hat{V}_t$ is a sine wave of frequency $f_s$, these signals can be expressed respectively as $\hat{V}_{nc}+\hat{V}_{np}$, $\hat{V}_{sc}+\hat{V}_{sa}$ and $\hat{V}_{tc}$. When these expressions are substituted into the equation for $\hat{V}_n$ in terms of $\hat{V}_s$ and $\hat{V}_t$, the phase modulation components and amplitude modulation components can be separately equated to show that $\hat{V}_{sa}$ and $\hat{V}_{np}$ are both zero. Therefore, the effect of $\hat{V}_t$ is to produce a small constant change in the amplitude of $\hat{V}_s$ and a small constant change in the phase of $\hat{V}_n$.

Figure 5A:
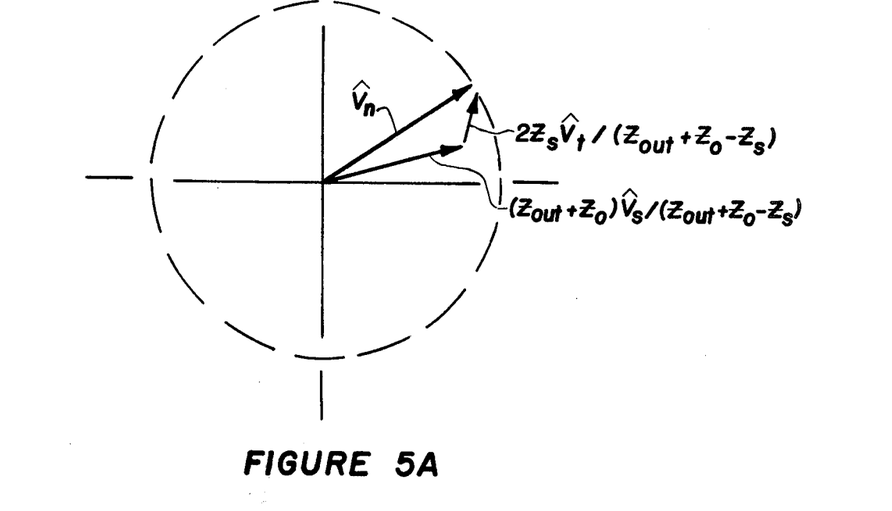
FIG. 5A is a phasor diagram illustrating the relationship between the source voltage $\hat{V}_s$, the test voltage $\hat{V}_t$ and the node voltage $\hat{V}_n$.

The effect of $\hat{V}_t$ on $\hat{V}_n$ is illustrated in the phasor diagram of FIG. 5A. As the phase of $\hat{V}_t$ is varied the amplitude of $\hat{V}_s$ varies to keep $\hat{V}_n$ on the dotted circle of radius $\hat{V}_{nom}$. The radius of the dotted circle is determined by the reference voltage $\hat{V}_{ref}$ employed in the feedback loop. Because $\hat{V}_t$ is much smaller than $\hat{V}_s$, the variation in the phase of $\hat{V}_n$ as the phase of $\hat{V}_t$ is varied is very small.

Figure 5B:
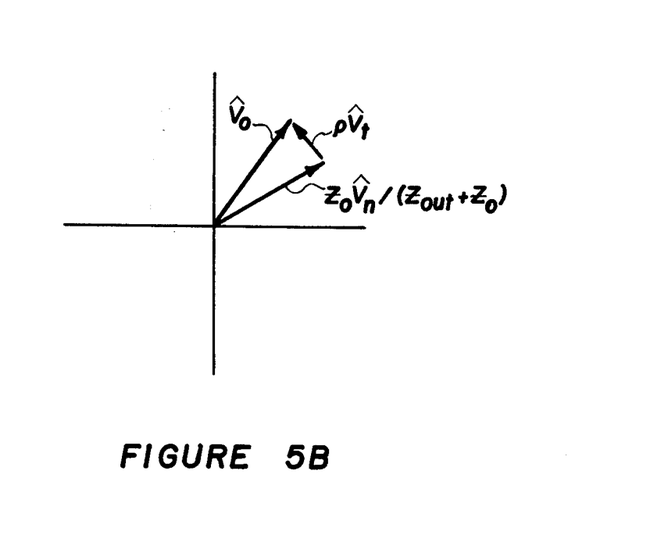
FIG. 5B is a phasor diagram illustrating the relationship between the node voltage $\hat{V}_n$, the test voltage $\hat{V}_t$ and the output voltage $\hat{V}_o$.

The effect of $\hat{V}_t$ on $\hat{V}_o$ can be seen by inspection of FIG. 5B and the equation for $\hat{V}_o$ in terms of $\hat{V}_n$ and $\hat{V}_t$ (i.e., $\hat{V}_o=\rho\hat{V}_t+Z_o\hat{V}_n/(Z_{out}+Z_o)$). As the phase of $\hat{V}_t$ varies through $2\pi$ radians, the magnitude of $\rho\hat{V}_t$ remains constant but its direction varies through $2\pi$ radians. Likewise, as the phase of $\hat{V}_t$ varies through $2\pi$ radians the magnitude of $Z_o\hat{V}_n/(Z_{out}+Z_o)$ remains constant buts its direction varies only slightly. Therefore, the relative angle between the vectors $\rho\hat{V}_t$ and $Z_o\hat{V}_n/(Z_{out}+Z_o)$ varies through $2\pi$ radians so that the magnitude of $\hat{V}_o$ varies between $|Z_o\hat{V}_n/(Z_{out}+Z_o)|-|\rho\hat{V}_t|$ and $|Z_o\hat{V}_n/(Z_{out}+Z_o)|+|\rho\hat{V}_t|$. The absolute value r of $\rho$ is therefore equal to the magnitude of amplitude change of $\hat{V}_o$ as the phase of $\hat{V}_t$ is varied divided by twice the amplitude of $\hat{V}_t$ (i.e., $r=(|\hat{V}_o|_{max}-|\hat{V}_o|_{min})/2|\hat{V}_t|$).

The value of r can be measured by an apparatus as shown in FIG. 2 for a signal detector 218 capable of measuring the amplitude of a sine wave. Detector 218 can thus be selected to be a digital voltmeter such as the Model 3437A system voltmeter by Hewlett-Packard Company. Microprocessor 219 is programmed to step the phase of $\hat{V}_t$ through $2\pi$ radians, to store the maximum and minimum values of $|\hat{V}_o|$, to store the value of $|\hat{V}_t|$ and to calculate r from these stored values.

Alternatively the phase of $\hat{V}_t$ can be varied continuously so that the test signal becomes a phase modulated sine wave. The output signal $\hat{V}_o$ then becomes a phase and amplitude modulated signal from which $|\hat{V}_o|_{max}-|\hat{V}_o|_{min}$ can be measured by an amplitude modulation detector. FIG. 2 again shows an apparatus suitable for testing an ALC source, but in this embodiment signal detector 218 is an amplitude modulation detector and test signal generator 213 must be capable of production phase modulated sine waves at the carrier frequency of the ALC source. A signal generator suitable for providing a test signal which can be stepped or swept in phase in the HP3336C.

APPENDIX

Figure 4A:
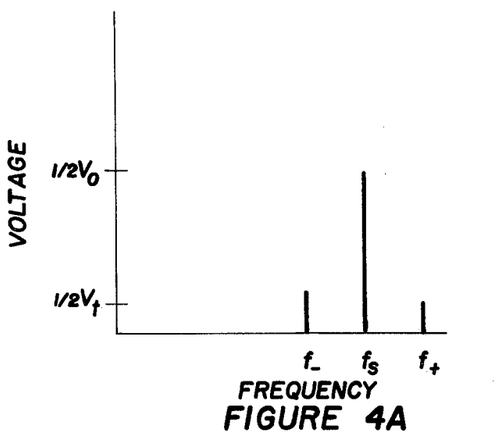
FIG. 4A shows the spectral distribution of an amplitude modulated sine wave.

By use of standard trigonometric identities an amplitude modulated sine wave of the form $(V_o+V_m\cos 2\pi f_m t)\cos 2\pi f_s t$ can be rewritten as $\hat{V}_c+\hat{V}_a$ where $\hat{V}_c$ is the sine wave $V_o\cos 2\pi f_s t$ and where $V_a$ is the sum $V_m(\cos 2\pi f_+ t+\cos 2\pi f_- t)/2$ (where $f_+=f_s+f_m$ and $f_-=f_s-f_m$). The frequency distribution of such an amplitude modulated sine wave is therefore represented by a graph of the form shown in FIG. 4A. In the general case of an amplitude modulated sine wave of the form $(V_o+V_a(t))\cos 2\pi f_s t$, $V_a(t)$ can be expanded as a sum of Fourier components before application of this trigonometric identity to show that a general amplitude modulated sine wave has the form $\hat{V}_c+\hat{V}_a$ where $\hat{V}_c$ is a sine wave of frequency $f_s$ and $\hat{V}_a$ is a signal having a frequency distribution which is symmetric about $f_s$.

By use of a first order expansion in $\phi$ and standard trigonometric identities, a phase modulated signal of the form $V_o\cos(2\pi f_s t-\phi\sin 2\pi f_m t)$ can be rewritten in the form (for $\phi<<1$):

$$V_o\cos 2\pi f_s t + V_o\phi\sin 2\pi f_m t = V_o\cos 2\pi f_s t + V_t(\cos 2\pi f_- t - \cos 2\pi f_+ t)$$

where $V_t=V_o\phi/2$.

Figure 4B:
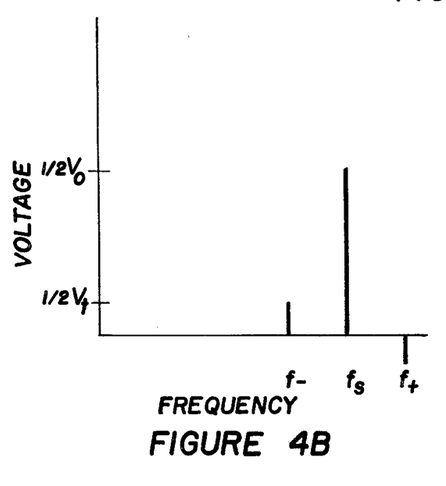
FIG. 4B shows the spectral distribution of a phase modulated sine wave.

The frequency distribution of such a phase modulated sine wave is thus of the form shown in FIG. 4B. In the more general case of a phase modulated sine wave of the form $V_o\cos(2\pi f_s t+\phi_p(t))$, the signal can be represented as $\hat{V}_c+\hat{V}_p$ where $\hat{V}_p$ is a signal having a frequency distribution $\hat{V}_p(f)$ of the form $-(i/2)[V_o\tilde{\phi}(f-f_s)-V_o\tilde{\phi}(f+f_s)]$ where $\tilde{\phi}(f)$ is the Fourier transform of $$\phi(t) \text{ (i.e. } \phi(t) = \int_{-\infty}^{\infty} \tilde{\phi}(f) \exp(i2\pi ft)df).$$

Figure 4C:
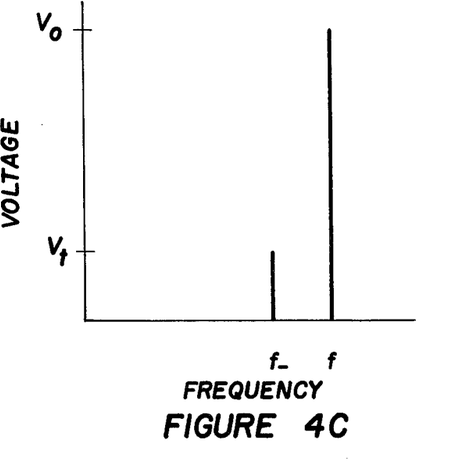
FIG. 4C is the sum of the distributions in FIGS. 4A and 4B and is the distribution for a wave which is both amplitude and phase modulated.

In the case of a sine wave which is both amplitude and phase modulated, the signal can be represented in the form $\hat{V}_c+\hat{V}_a+\hat{V}_p$. In particular, the signal shown in FIG. 4C can be written in this form using $\hat{V}_c=V_o\cos 2\pi f_s t$, $\hat{V}_a=V_t(\cos 2\pi f_-t+\cos 2\pi f_+t)/2$ and $\hat{V}_p=V_t(\cos 2\pi f_-t-\cos 2\pi f_+t)/2$ so that a signal which is the sum of two sine waves can be broken up into amplitude modulation and phase modulation components if $V_t<<V_o$.

We can also break the test signal $\hat{V}_t$ into $\hat{V}_{ta}+\hat{V}_{tp}$ where $\hat{V}_{ta}=V_t(\cos 2\pi f_-t+\cos 2\pi f_+t)/2$, where $\hat{V}_{tp}=V_t(\cos 2\pi t_+t-\cos 2\pi f_+t/2$, and where $f_-=f_t$.

I claim:

1. A method of measuring the absolute value of the reflection coefficient between a transmission line of known characteristic impedance $Z_o$ and the output port of an automatic level controlled source, said method comprising the steps of:
    (a) activating the automatic level controlled source to produce an output signal of known amplitude $V_{nom}$ and frequency $f_s$ at the output port of the automatic level controlled source;
    (b) coupling the transmission line of characteristic impedance $Z_o$ to the output port of the automatic level controlled source;
    (c) applying a test signal of known amplitude $V_t$ and frequency $f_t$ through the transmission line to the output port of the automatic level controlled source to perturb the output signal of the automatic level controlled source;
    (d) detecting the magnitude of the amplitude modulation component of the resulting perturbed output signal; and
    (e) determining the absolute value of the reflection coefficient from $V_t$ and the magnitude of the amplitude modulation component of the output signal.

2. A method as in claim 1 wherein the steps of coupling a transmission line to the output port of the automatic level controlled source, applying a test signal and detecting the output signal comprising the steps of:
    (f) coupling the transmission port of a directional bridge of known characteristic impedance $Z_o$ to the output port of the automatic level controlled source;
    (g) applying the test signal to the input port of the directional bridge; and
    (h) detecting the amplitude of the signal produced at the output port of the directional bridge.

3. A method as in claim 2 further comprising, before step (f), the additional steps of:
    (i) estimating the expected output impedance of the automatic level controlled source; and
    (j) selecting a directional bridge of characteristic impedance matching the expected output impedance of the automatic level controlled source.

4. A method as recited in claim 1 in which the automatic level controlled source utilizes an a.c. to d.c. converter which is responsive to the signal at the output port of the automatic level controlled source to hold essentially constant the amplitude of the signal at said output port, said method further comprising, before step (c), the steps of:
    (k) selecting $f_s$ to be much larger than the inverse of the characteristic time of response T of the a.c. to d.c. converter in the automatic level controlled source;
    (l) selecting $f_t$ to lie in the range of values which satisfy $|f_s-f_t|<<T^{-1}$; and
    (m) selecting $V_t$ to be much smaller than $V_{nom}$.

5. An apparatus for measuring the absolute value of the reflection coefficient between a transmission line of known characteristic impedance $Z_o$ and the output port of an automatic level controlled source, said apparatus comprising:
    a directional bridge having a transmission port to be coupled to the output port of the automatic level controlled source under test and having an input port and an output port;
    a signal generator coupled to the input port of the directional bridge to produce input test signals to perturb the output signal of the automatic level controlled source; and
    an amplitude modulation detector coupled to the output port of the directional bridge to detect the magnitude of the amplitude modulation component of the perturbed output signal of the automatic level controlled source.

6. An apparatus as in claim 5 further comprising a microprocessor coupled to the amplitude modulation detector and responsive to the amplitude $V_t$ of the test signal to calculate the absolute value of the reflection coefficient between the directional bridge and the output port of the automatic level controlled source.

7. A method of measuring the absolute value of the reflection coefficient between a transmission line of known characteristic impedance $Z_o$ and the output port of an automatic level controlled source, said method comprising the steps of:
    (a) activating the automatic level controlled source to produce an output signal of known amplitude $V_{nom}$ and frequency $f_s$ at the output port of the automatic level controlled source;
    (b) coupling the transmission line of characteristic impedance $Z_o$ to the output port of the automatic level controlled source;
    (c) applying a phase modulated test signal of known amplitude $V_t$ and carrier frequency $f_s$ through the transmission line to the output port of the automatic level controlled source to perturb the output signal of the automatic level controlled source;
    (d) detecting the peak to peak magnitude of the amplitude modulation component of the resulting perturbed output signal; and
    (e) determining the absolute value of the reflection coefficient from $V_t$ and the magnitude of the amplitude modulation component of the output signal.

8. A method of measuring the absolute value of the reflection coefficient between a transmission line of known characteristic impedance $Z_o$ and the output port of an automatic level controlled source, said method comprising the steps of:
    (a) activating the automatic level controlled source to produce an output signal of known amplitude $V_{nom}$ and frequency $V_s$ at the output port of the automatic level controlled source;

(b) coupling the transmission line of characteristic impedance $Z_o$ to the output port of the automatic level controlled source;

(c) applying a test signal of known amplitude $V_t$ and frequency $f_s$ through the transmission line to the output port of the automatic level controlled source to perturb the output signal of the automatic level controlled source;

(d) repeatedly incrementing the phase of the test signal through a range of values which includes at least one maximum and one minimum of the amplitude of the output signal;

(e) measuring the amplitude of the output signal at each value of the phase of the test signal; and (f) calculating the absolute value of the output reflection coefficient from $V_t$ and from the maximum and minimum values of the amplitude of the output signal.

9. An apparatus for measuring the absolute value of the reflection coefficient between a transmission line of known characteristic impedance $Z_o$ and the output port of an automatic level controlled source, said apparatus comprising:

a directional bridge having a transmission port to be coupled to the output port of the automatic level controlled source under test and having an input port and an output port;

a signal generator coupled to the input port of the directional bridge to produce input test signals to perturb the output signal of the automatic level controlled source;

an amplitude detector coupled to the output port of the directional bridge to detect the amplitude of the perturbed output signal of the automatic level controlled source; and phase shifting means coupled to the signal generator for incrementing the phase of the test signal.

10. A method of measuring the absolute value of the reflection coefficient between a transmission line of known characteristic impedance $Z_o$ and the output port of an automatic level controlled source, said method comprising the steps of:

(a) activating the automatic level controlled source to produce an output signal of known amplitude $V_{nom}$ and frequency $f_s$ at the output port of the automatic level controlled source;

(b) coupling the transmission line of characteristic impedance $Z_o$ to the output port of the automatic level controlled source;

(c) applying a test signal of known frequency distribution $\overline{V}(f_t)$ through the transmission line to the output port of the automatic level controlled source to perturb the output signal of the automatic level controlled source;

(d) detecting the magnitude of the amplitude modulation component of the resulting perturbed output signal; and (e) determining the absolute value of the reflection coefficient from $\overline{V}(f_t)$ and the magnitude of the amplitude modulation component of the output signal.

* * * * *

UNITED STATES PATENT AND TRADEMARK OFFICE
CERTIFICATE OF CORRECTION

PATENT NO. : 4,359,682
DATED : November 16, 1982
INVENTOR(S) : Phillip D. Winslow Page 1 of 2

It is certified that error appears in the above—identified patent and that said Letters Patent is hereby corrected as shown below:

In column 2, line 40, after "source." begin a new paragraph.

In column 5, line 7, replace "$\hat{V}_{nc}$" with -- $\hat{V}_{nc}$ --; line 9, replace "$\hat{V}_n$" with -- $V_n$ --; line 68, replace "$\hat{V}_{ref}$" with -- $V_{ref}$ --.

In column 6, line 1, replace "$\hat{V}_t$" with -- $V_t$ -- and replace "$\hat{V}_s$" with -- $V_s$ --; line 37, replace "production" with -- producing --; line 41, replace "in" with -- is --; line 46 replace "$\hat{V}_{c;1}$" with -- $V_c$ --; line 58, per Amendment A, replace "which is symmetric about $f_s$" with -- $\tilde{V}_a(f)$ of the form $(1/2)$ $[\tilde{V}_a(f-f_s) + \tilde{V}_a(f+f_s)]$ where $\tilde{V}_a(f)$ is the Fourier transform of $V_a(t)$ (i.e. $V_a(t) = \int_{-\infty}^{\infty}\tilde{V}_a(f)\exp(i2\pi ft)df$) --; line 64 after "$V_o\phi\sin 2\pi f_s t$" insert -- $\sin 2\pi f_m t$ --.

UNITED STATES PATENT AND TRADEMARK OFFICE
CERTIFICATE OF CORRECTION

PATENT NO. : 4,359,682

DATED : November 16, 1982

INVENTOR(S) : Phillip D. Winslow

It is certified that error appears in the above—identified patent and that said Letters Patent is hereby corrected as shown below:

In column 7, line 9, replace "$\phi(f)$" with -- $\hat{\phi}(f)$ --; line 22, replace "cos $2\pi t_t t$" with -- cos $2\pi f_- t$ --.

Signed and Sealed this

Twenty-fourth Day of May 1983

[SEAL]

Attest:

DONALD J. QUIGG

*Attesting Officer*   *Acting Commissioner of Patents and Trademarks*